United States Patent
Mehta

(10) Patent No.: US 7,098,577 B2
(45) Date of Patent: Aug. 29, 2006

(54) PIEZOELECTRIC SWITCH FOR TUNABLE ELECTRONIC COMPONENTS

(75) Inventor: Sarabjit Mehta, Calabasas, CA (US)

(73) Assignee: HRL Laboratories, LLC, Malibu, CA (US)

( * ) Notice: Subject to any disclaimer, the term of this patent is extended or adjusted under 35 U.S.C. 154(b) by 8 days.

(21) Appl. No.: 10/421,327

(22) Filed: Apr. 22, 2003

(65) Prior Publication Data

US 2004/0075366 A1     Apr. 22, 2004

Related U.S. Application Data

(60) Provisional application No. 60/420,175, filed on Oct. 21, 2002.

(51) Int. Cl.
*H01L 41/47* (2006.01)
*H01L 41/83* (2006.01)

(52) U.S. Cl. ............ 310/332; 310/366; 310/365; 310/364; 310/330; 310/331

(58) Field of Classification Search ........ 310/308–309, 310/328, 330–332, 364–366
See application file for complete search history.

(56) References Cited

U.S. PATENT DOCUMENTS

| | | | | |
|---|---|---|---|---|
| 3,325,743 A | * | 6/1967 | Blum | 310/332 |
| 3,513,356 A | * | 5/1970 | Newell | 310/332 |
| 3,603,921 A | * | 9/1971 | Dreisbach | 367/155 |
| 3,646,413 A | | 2/1972 | Oomen | 317/246 |
| 4,099,211 A | * | 7/1978 | Hathaway | 310/332 |
| 4,237,399 A | | 12/1980 | Sakamoto | 310/317 |
| 4,716,331 A | | 12/1987 | Higgins, Jr. | 310/330 |
| 4,717,847 A | * | 1/1988 | Nolan | 326/65 |
| 4,916,349 A | | 4/1990 | Kornrumpf | 310/332 |
| RE33,568 E | | 4/1991 | Harnden, Jr. et al. | 310/332 |
| RE33,691 E | * | 9/1991 | Harnden et al. | 310/332 |
| 5,089,740 A | | 2/1992 | Ono | 310/328 |
| 5,093,600 A | | 3/1992 | Kohl | 310/332 |
| 5,101,278 A | * | 3/1992 | Itsumi et al. | 310/332 |
| 5,548,313 A | | 8/1996 | Lee | 347/68 |
| 5,870,007 A | | 2/1999 | Carr et al. | 333/262 |
| 6,127,908 A | | 10/2000 | Bolzer et al. | 333/246 |
| 6,212,056 B1 | | 4/2001 | Gammel et al. | 361/277 |
| 6,215,644 B1 | | 4/2001 | Dhuler | 361/380 |

(Continued)

FOREIGN PATENT DOCUMENTS

JP     04184985 A     7/1992

(Continued)

OTHER PUBLICATIONS

Dec, A., et al., "Micromachined Varactor With Wide Tuning Range," *Electronic Letters*, vol. 33, No. 11, pp. 922-924 (May 22, 1997).

(Continued)

*Primary Examiner*—Darren Schuberg
*Assistant Examiner*—J. Aguirrechea
(74) *Attorney, Agent, or Firm*—Ladas & Parry LLP

(57) ABSTRACT

A piezoelectric switch for tunable electronic components comprises piezoelectric layers, metal electrodes alternated with the layers and contact pads. Cross voltages are applied to the electrodes, in order to obtain an S-shaped deformation of the switch and allow contact between the contact pads. Additionally, a further electrode can be provided on a substrate where the switch is fabricated, to allow an additional electrostatic effect during movement of the piezoelectric layers to obtain contact between the contact pads. The overall dimensions of the switch are very small and the required actuation voltage is very low, when compared to existing switches.

27 Claims, 12 Drawing Sheets

U.S. PATENT DOCUMENTS

| | | | |
|---|---|---|---|
| 6,377,438 B1 | 4/2002 | Deane et al. | 361/278 |
| 6,404,304 B1 | 6/2002 | Kwon et al. | 333/202 |
| 6,479,920 B1 * | 11/2002 | Lal et al. | 310/309 |
| 6,496,351 B1 | 12/2002 | Hill et al. | 361/278 |
| 6,504,118 B1 * | 1/2003 | Hyman et al. | 310/332 |
| 6,606,235 B1 | 8/2003 | Chua et al. | 361/278 |
| 6,662,029 B1 | 12/2003 | Eden et al. | 505/210 |
| 6,768,628 B1 | 7/2004 | Harris et al. | 361/277 |
| 2002/0050882 A1 | 5/2002 | Hyman et al. | 335/78 |
| 2002/0109436 A1 | 8/2002 | Peng et al. | 310/328 |

FOREIGN PATENT DOCUMENTS

| | | |
|---|---|---|
| JP | 09148643 A | 6/1997 |
| JP | 2002-170470 | 6/2002 |
| WO | 89/07345 | 8/1999 |
| WO | 01/13457 A1 | 2/2001 |
| WO | 02/45181 A1 | 6/2002 |

OTHER PUBLICATIONS

Li, M., et al., "New Tunable Phase Shifters Using Perturbed Dielectric Image Lines," *IEEE Transactions on Microwave Theory and Techniques*, vol. 46, No. 9, pp. 1314-1317 (Sep. 1998).

Yun, T., "Analysis and Optimization of a Phase Shifter Controlled by a Piezoelectric Transducer," *IEEE Transactions on Microwave Theory and Techniques*, vol. 50, No. 1, pp. 105-111 (Jan. 2002).

* cited by examiner

PIEZOELECTRIC SWITCH FOR TUNABLE ELECTRONIC COMPONENTS

CLAIM OF BENEFIT OF PROVISIONAL APPLICATION

This application claims the benefit of U.S. provisional application Ser. No. 60/420,175 filed on Oct. 21, 2002, which is incorporated herein by reference in its entirety.

CROSS-REFERENCE TO RELATED APPLICATIONS

The present document is related to the copending and commonly assigned patent application documents entitled "Variable Capacitance Membrane Actuator for Wide Band Tuning Microstrip Resonators and Filters," Ser. No. 10/421,302, and "Piezoelectric Actuator for Tunable Electronic Components," Ser. No. 10/421,303, which are all filed of even date herewith. The contents of these related applications are hereby incorporated by reference herein.

FIELD OF THE INVENTION

The present invention relates to micro-electromechanical systems (MEMS) and, in particular, to a micromachined piezoelectric switch for tunable electronic components which can achieve substantial deflections, while keeping the overall switch dimensions small.

BACKGROUND OF THE INVENTION

MEMS switches have a wide variety of uses. They can, for example, conduct RF current in applications involving the use of antenna phase shifters, in the tuning of reconfigurable antenna elements and in the fabrication of tunable filters.

MEMS switches provide several advantages over conventional switches which use transistors. These advantages include lower insertion loss, improved electrical isolation over a broad frequency range, and lower power consumption. Also, as this type of switch is fabricated using existing integrated circuit (IC) processing technologies, production costs are relatively low. Thus, MEMS switches manufactured using micromachining techniques have advantages over conventional transistor-based switches because the MEMS switches function like macroscopic mechanical switches, but without the associated bulk and relatively high cost.

The energy that must be moved through the switch control in order to activate the MEMS switch, and thus the energy dissipated by the MEMS switch, is a function of the actuation voltage. Therefore, in order to minimize the energy dissipated by the MEMS switch, it is desirable to minimize the actuation voltage of the switch.

Current MEMS switches operate through adoption of electrostatic techniques. In order to have low actuation voltages (about 50 V), existing electrostatic actuation switches need to have relatively large (about 300 to 500 microns) lateral dimensions. This results in an increased response time. A substantial reduction in the size of these switches is not possible as that significantly increases the actuation voltages. Therefore, electrostatic actuation MEMS switches cannot be further miniaturized as required for further applications. The large dimensions also reduce the restoring force for switch release, thus contributing to a 'stiction' problem that essentially renders the switch useless. In particular, the contacting pads tend to adhere to each other after a prolonged use.

Piezoelectric structures can be used to realize tunable capacitors, as disclosed in "Micromachined RF Mems tunable capacitors using piezoelectric actuators", Jae Y. Park, Young J. Yee, Hyo J. Nam, and Jong U. Bu, IEEE 2001.

In view of the foregoing, there is a need for a micro-electromechanical switch having a low actuation voltage and a fast response time.

SUMMARY OF THE INVENTION

The present invention provides a novel layered (unimorph, bimorph or multimorph) piezoelectric switch that requires a very low actuation voltage (about 10 V), while keeping the overall lateral dimensions small (about 60 µm).

This is made possible by applying opposing (or crossed) actuation voltages across the length of the switch, causing a 'S' shaped switch deformation. The switch has a fast response time (about 2 microseconds) and avoids the problems associated with conventional electrostatic switches.

Additionally, this is made possible by a piezoelectric-electrostatic switch that uses a novel approach of combining the piezoelectric and electrostatic effects without using any extra electrodes on the active layer, allowing voltages significantly lower as compared to electrostatic switches of similar dimensions.

According to a first aspect of the present invention, a piezoelectric actuator is provided, comprising: an upper piezoelectric layer; a lower piezoelectric layer; a first electrode placed under the lower piezoelectric layer; a second electrode and a third electrode placed between the upper layer and the lower layer; and a fourth electrode placed above the upper piezoelectric layer.

According to a second aspect of the present invention, a deformable micro electromechanical structure is provided, comprising: a piezoelectric layer having a first side and a second side; a first electrode connected with the first side of the piezoelectric layer; a second electrode connected with the second side of the piezoelectric layer and with a first voltage having a first polarity; and a third electrode connected with the second side of the piezoelectric layer and with a second voltage having a second polarity opposite the first polarity, whereby said structure undergoes a substantially S-shaped deformation upon application of said voltage.

According to a third aspect of the present invention, a method of fabricating a micro electromechanical switch on a substrate is provided, the method comprising the steps of: providing a substrate; depositing a first metal layer on the substrate; depositing a sacrificial layer on the substrate and on the first metal layer; depositing a second metal layer on the sacrificial layer; depositing a support layer on the sacrificial layer and the second metal layer; depositing a third metal layer on the support layer; depositing a first piezoelectric layer on the third metal layer; depositing a fourth metal layer on the first piezoelectric layer; patterning the fourth metal layer to form two separate metal layers on the first piezoelectric layer; and removing the sacrificial layer.

According to a fourth aspect of the present invention, a method of fabricating a micro electromechanical switch on a substrate is provided, comprising the steps of: providing a substrate; depositing a first metal layer on the substrate; depositing a sacrificial layer on the substrate and on the first metal layer; depositing a support layer on the sacrificial layer; depositing a second metal layer on the support layer and patterning the second metal layer to form a first contact pad; depositing a separation layer on the support layer and the first contact pad; depositing a third metal layer on the separation layer; depositing a first piezoelectric layer on the third metal layer; depositing a fourth metal layer on the first piezoelectric layer; and removing the sacrificial layer.

According to a fifth aspect of the present invention, a micro electromechanical switch formed on a substrate is provided, comprising: an upper piezoelectric layer; a lower piezoelectric layer; a first electrode placed under the lower piezoelectric layer; a second electrode placed between the upper piezoelectric layer and the lower piezoelectric layer; and a third electrode placed on the upper piezoelectric layer.

According to a sixth aspect of the present invention, a micro electromechanical switch is provided, formed on a substrate and operating under a combined piezoelectric and electrostatic effect, the switch comprising: a first piezoelectric layer; a second piezoelectric layer; a first electrode placed under the second piezoelectric layer; a second electrode placed between the first piezoelectric layer and the second piezoelectric layer; a third electrode placed on the first piezoelectric layer; and a fourth electrode placed on the substrate.

According to a seventh aspect, a method of fabricating a micro electromechanical switch on a substrate is provided, comprising the steps of: providing a substrate; depositing a first metal layer on the substrate; patterning the first metal layer to form two separate metal layers on the substrate; depositing a sacrificial layer on the substrate and on the two separate metal layers; depositing a second metal layer on the sacrificial layer; depositing a support layer on the second metal layer and the sacrificial layer; depositing a third metal layer on the support layer; depositing a first piezoelectric layer on the third metal layer; depositing a fourth metal layer on the first piezoelectric layer; and removing the sacrificial layer.

According to an eighth aspect, a method of fabricating a micro electromechanical switch on a substrate is provided, comprising the steps of: providing a substrate; depositing a first metal layer on the substrate; patterning the first metal layer to form two separate metal layers on the substrate; depositing a sacrificial layer on the substrate and on the two separate metal layers; depositing a support layer on the sacrificial layer; depositing a second metal layer on the support layer and patterning the second metal layer to form a first contact pad; depositing a separation layer on the support layer and the first contact pad; depositing a third metal layer on the separation layer; depositing a first piezoelectric layer on the third metal layer; depositing a fourth metal layer on the first piezoelectric layer; and removing the sacrificial layer.

According to a ninth aspect, a micro electromechanical switch is provided, formed on a substrate and operating under a combined piezoelectric and electrostatic effect, the switch comprising: a first piezoelectric layer; a second piezoelectric layer; a first electrode placed under the second piezoelectric layer; a second electrode and a third electrode placed between the first piezoelectric layer and the second piezoelectric layer; a fourth electrode placed on the first piezoelectric layer; and a fifth electrode placed on the substrate.

Compared to existing switch designs, the invention possesses substantially reduced lateral dimensions, while further lowering actuation voltages to about 10 V. This small size enables the invention to achieve much faster (about 1 microsecond) response times. In addition, a large restoring force can be generated to release the switch, thereby alleviating the severe problem of stiction associated with most switch designs.

BRIEF DESCRIPTION OF THE DRAWINGS

The features and advantages of the present invention will become better understood with regard to the following description, appended claims, and accompanying drawings where:

FIGS. 2A–2C show views of a MEMS switch according to a first embodiment of the present invention, wherein FIG. 2A shows the switch in an open position and FIG. 2C shows the switch in a closed position;

FIGS. 3A–3B show views of a MEMS switch according to a second embodiment of the present invention, wherein FIG. 3A shows the switch in an open position and FIG. 3B shows the switch in a closed position;

FIGS. 7A–7B show views of a MEMS switch according to a third embodiment of the present invention, wherein FIG. 7A shows the switch in an open position and FIG. 7B shows the switch in a closed position;

FIGS. 8A–8C show views of a MEMS switch according to a fourth embodiment of the present invention, wherein FIG. 8A shows the switch in an open position and FIG. 8C shows the switch in a closed position;

FIGS. 12A–12B show views of a MEMS switch according to a fifth embodiment of the present invention, wherein FIG. 12A shows the switch in an open position and FIG. 12B shows the switch in a closed position.

DETAILED DESCRIPTION OF THE INVENTION

Figure 1A:
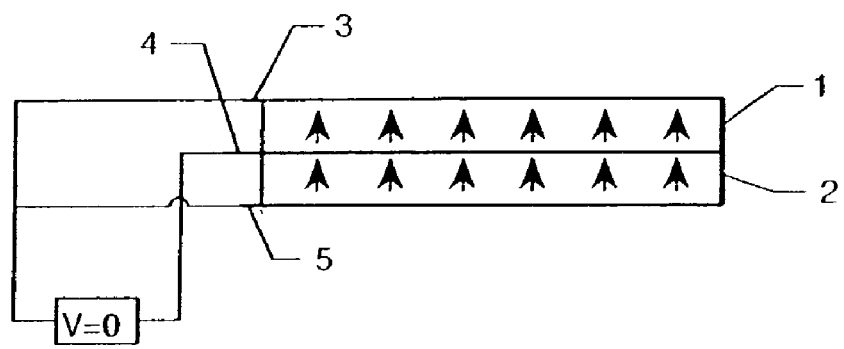
FIGS. 1A–1C show schematic views of a two-layered piezoelectric actuator with parallel polarization directions, to be used in accordance with the present invention.
Figure 1B:
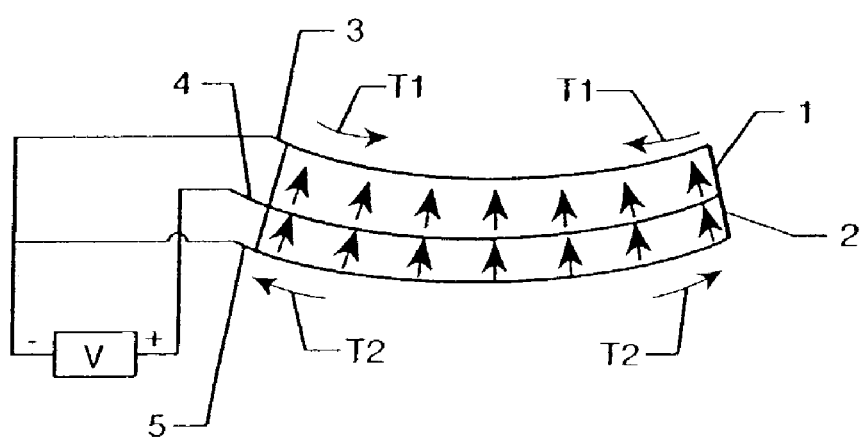
Figure 1C:
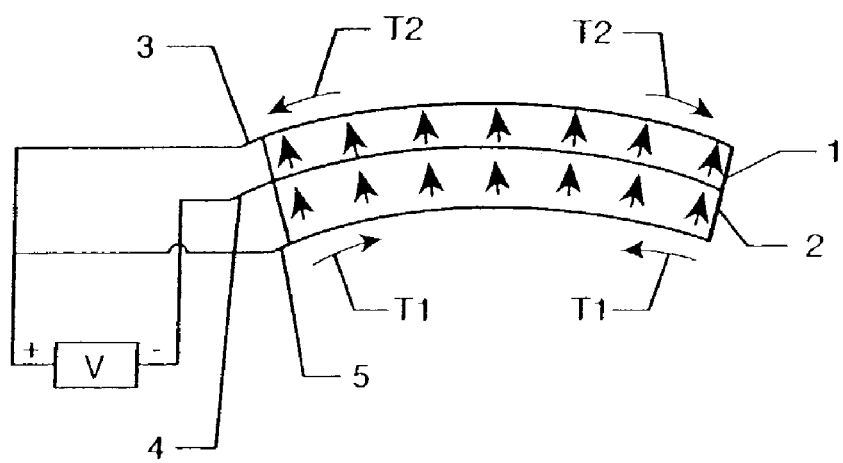

FIGS. 1A to 1C show schematic views of a two-layered piezoelectric actuator with parallel polarization directions to be used in accordance with the present invention. The polarization directions are shown by the small arrows depicted within each layer. The actuator shown in FIGS. 1A–1C comprises an upper layer 1 and a lower layer 2. The layers 1, 2 are made, for example, of lead zirconate titanate (PZT) or lead lanthanum zirconate titanate (PLZT).

Electrodes 3, 4, and 5, shown in FIGS. 1A–1C, are alternated with layers 1 and 2. Layers 1 and 2 deflect on applying voltages between the electrodes 3, 4 and 5. On choosing the proper polarities for the voltage, a tensile force T1 or thrusting force T2 can be generated in the plane of the layers 1, 2. The forces T1, T2 will create a deflection in the middle section of the layers 1, 2. For a given piezoelectric material such as PZT or PLZT, the amount of deflection and force depends on the dimension of the layers, which can be adjusted to meet the requirements of the particular application. When no voltage is applied, the actuator does not cause the piezoelectric layer to be deflected, as shown in FIG. 1A. When voltage having a first polarity is applied, for example a positive polarity, the actuator causes the piezoelectric layer to be deflected in a first direction, for example upwards, as shown in FIG. 1B. When voltage having a second polarity, opposite to the first polarity (i.e. having a sign which is different from the sign of the first polarity), is applied, for example a negative polarity, the actuator causes the piezoelectric layer to be deflected in a second direction, for example downwards, as shown in FIG. 1C.

Figure 2A:
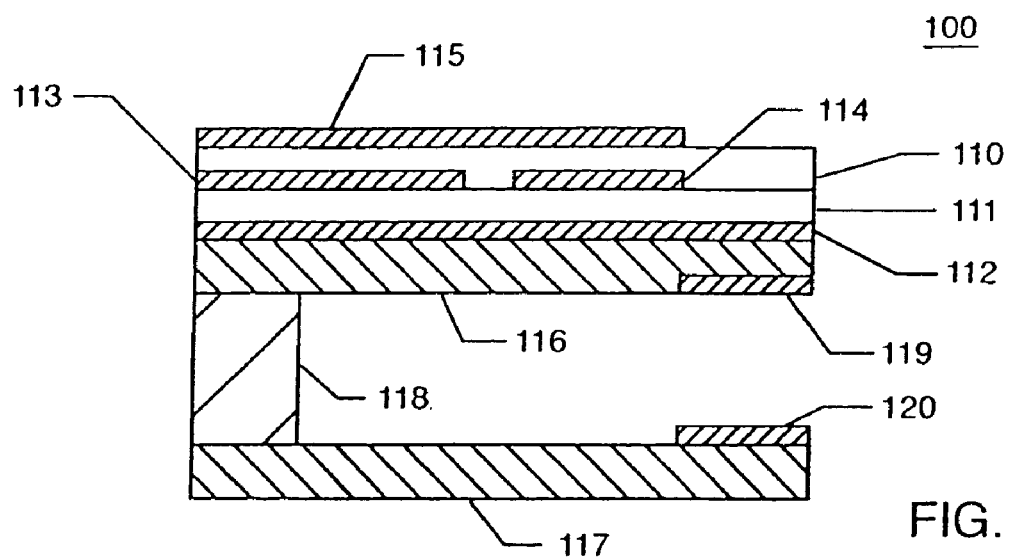
Figure 2B:
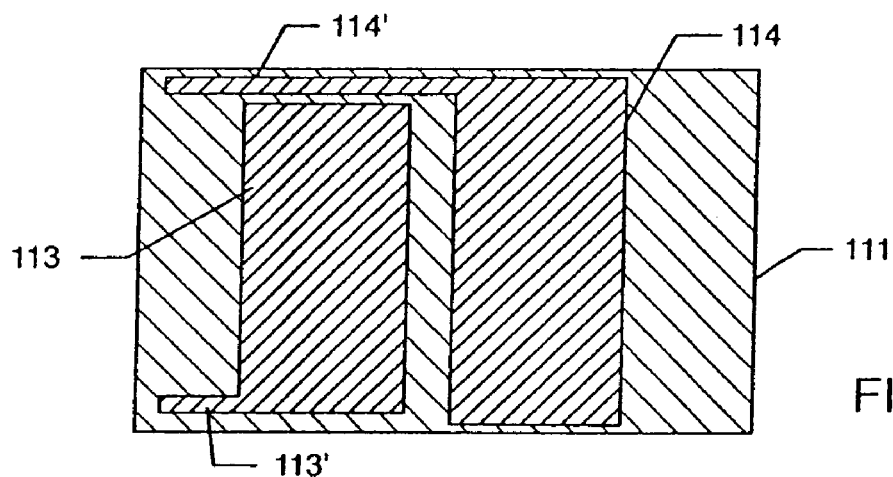
Figure 2C:
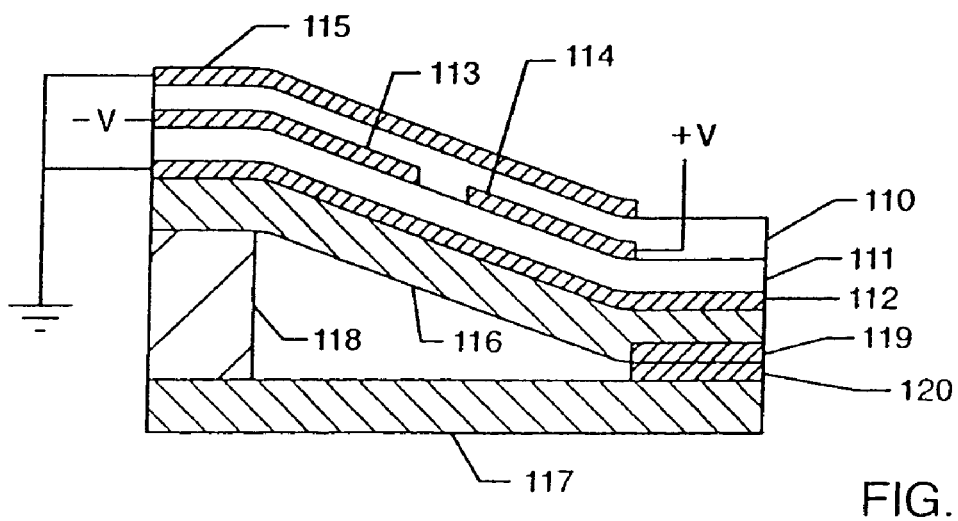

FIGS. 2A–2C show a switch according to a first embodiment of the present invention. The switch, generally designated 100, is fabricated on a substrate 117 using generally known microfabrication techniques, such as masking, etching, deposition, and lift-off. In a preferred embodiment, the switch 100 is directly formed on the substrate 117. Alternatively, the switch 100 may be discreetly formed and then bonded to the substrate 117.

The switch 100 comprises an upper piezoelectric layer 110, a lower piezoelectric layer 111, a first electrode 112 placed under the lower layer 111, a second electrode 113 placed between the upper layer 110 and the lower layer 111, a third electrode 114 placed between the upper layer 110 and the lower layer 111, a fourth electrode 115 placed above the upper layer 110, and a $Si_3N_4$ layer 116 placed under the electrode 112. In the preferred embodiment, shown in the figure, the electrode 112 extends along the whole length of the piezoelectric layer 111, in order to avoid contact between the piezoelectric layer 111 and the $Si_3N_4$ layer 116, which contact is sometimes undesired. A spacer 118 acting as a cantilever anchor separates the switch 100 from the substrate 117. Additionally, a first contact pad 119 is provided under the $Si_3N_4$ layer 116, and a second contact pad 120 is provided above the substrate 117. The first contact pad 119 operates as an electrical contact of the switch 100. FIG. 2A shows the switch in an 'OFF' position (contact pads 119, 120 separated). The contact pad 119, typically comprising a metal that does not oxidize easily, such as gold, platinum, titanium-platinum or titanium-gold, is positioned so as to face the second contact pad 120 on the substrate 117. Also the contact pad 120 typically comprises a metal that does not oxidize easily, such as gold, or platinum.

The switch 100 has a bilaminar cantilever (or bimorph) structure, that is, the structure comprises two active layers, layer 110 and layer 111. Due to the structure of the switch and to the mechanical properties of the piezoelectric material used for layers 110 and 111, the bimorph structure is piezoelectrically actuatable and has the advantage of exhibiting a very high ratio of displacement to actuation voltage. As a consequence, a relatively large displacement (approximately 1–2 microns) can be produced in the bimorph cantilever in response to a relatively low switching voltage (approximately 10 V).

The thickness of the layers 110, 120 and electrodes 112, 113, 114 and 115 and the height of the cantilever anchor 118 can be tightly controlled using known fabrication methods. The distance between the contact pads 119, 120 is, for example, about 1 micron. The length of the piezoelectric layers is, for example, about 70 microns. The piezoelectric layers 110, 111 are made, for example, of a PZT layer or a PLZT layer.

FIG. 2B shows in greater detail the preferred shape of the second electrode 113 and third electrode 114 placed above the lower layer 111 and comprising respective contacts 113' and 114' to a voltage source, not shown in the Figure. For example, the second electrode 113 can be connected to a negative voltage (e.g. −10 V) and the third electrode 114 can be connected to a positive voltage (e.g. +10 V).

The operation of the first embodiment will now be discussed with reference to FIG. 2C. In operation, the switch 100 is normally in an open, or "OFF," position as shown in FIG. 2A. The switch 100 is actuated to the closed, or "ON," position by application of a voltage between the four electrodes 112, 113, 114, and 115. More precisely, a positive voltage +V is applied to the third electrode 114, a negative voltage −V is applied to the second electrode 113, and the first electrode 112 and fourth electrode 115 are kept at ground voltage. When the voltage is applied, the left portion of the bimorph structure of FIG. 2C deflects as shown in FIG. 1C, and the right portion of the bimorph structure of FIG. 2C deflects as shown in FIG. 1B.

As a consequence, an 'S' shaped deformation or deflection is obtained, as shown in FIG. 2C. The 'S' shaped deformation is obtained by virtue of the 'crossed' actuation voltages applied to the second and third electrodes 113, 114, where the second electrode 113 is provided with a voltage having a first polarity (for example a negative voltage −V) and the third electrode 114 is provided with a voltage having a second polarity different from the first polarity (for example a positive voltage +V). By means of the deflection, the metal pad 119 is moved downwards and is brought into contact with the pad 120, thus actuating the switch to the "ON" position.

Figure 3A:
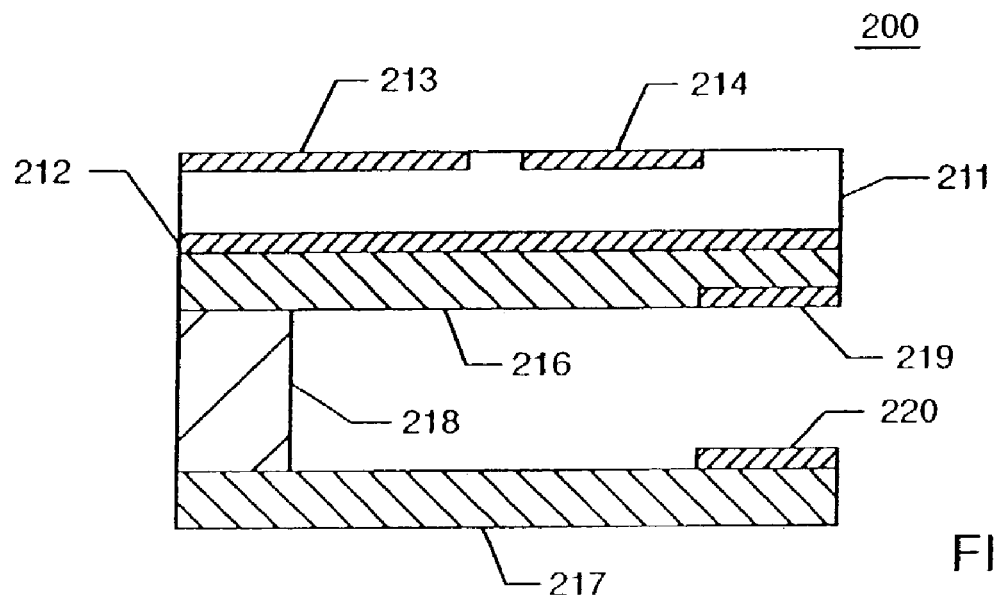
Figure 3B:
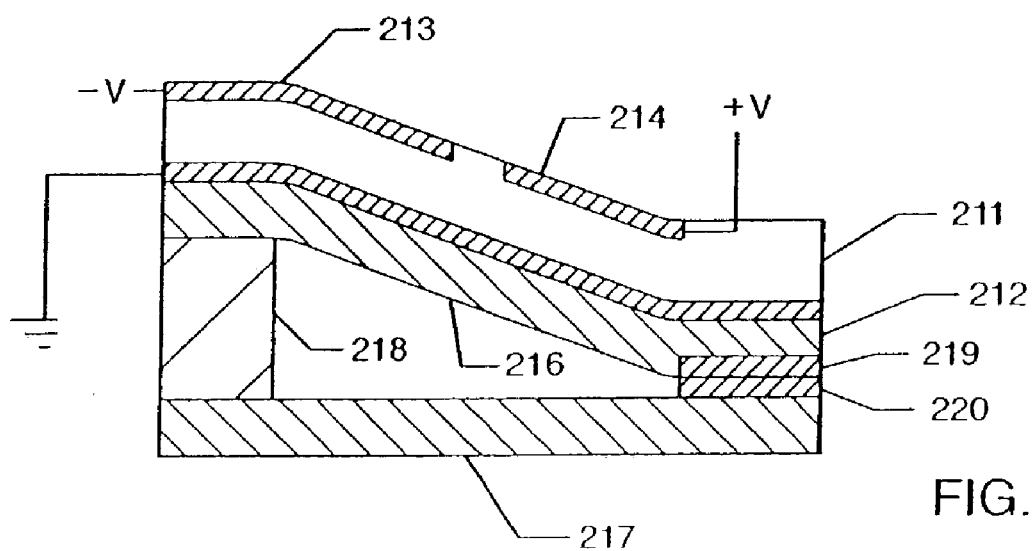

Also structures having a single piezoelectric or active layer are possible. An example of such structures is shown in FIGS. 3A and 3B. FIGS. 3A and 3B are similar to FIGS. 2A and 2C, respectively, the main difference being that the top piezoelectric layer 110 and the fourth electrode 115 are not provided. Also in this additional embodiment, an 'S' shaped deformation is obtained, due to the presence of the electrodes 213, 214 an to the opposite voltages −V, +V, shown in FIG. 3B, applied thereto.

One possible method of fabricating the switch 100 will now be described in FIGS. 4A–4F and FIGS. 5A–5E. The switch 100 may be manufactured using generally known microfabrication techniques, such as masking, etching, deposition and lift-off. The switch 100 may be fabricated using, for example, a foundry-based polysilicon surface-micromachining process, or a metal/insulator surface-micromachining process. The substrate 117 for one preferred embodiment may be a GaAs wafer, although other materials such as GaN, InP, ceramics, quartz or silicon may be used. Note that the switch 100 may be fabricated by processes other than that depicted in FIGS. 4 and 5. Further, while FIGS. 4 and 5 depict multiple separate fabrication steps, alternative fabrication processes may allow several separate steps to be combined into fewer steps. Finally, alternative fabrication processes may use a different sequence of steps.

Figure 4A:
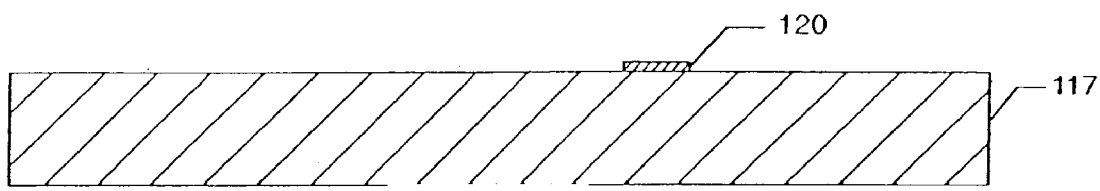
FIGS. 4A–4F and 5A–5E show process steps in fabricating the switch of FIGS. 2A–2C.

FIG. 4A shows a first step of the process, where the substrate 117 is provided and a first metal layer is deposited on the substrate 117. The first metal layer is patterned to form the bottom contact pad 120 using, for example, electron beam evaporation and liftoff. The metal layer is, for example, a 0.2 μm thick Ti/Pt layer.

Figure 4B:
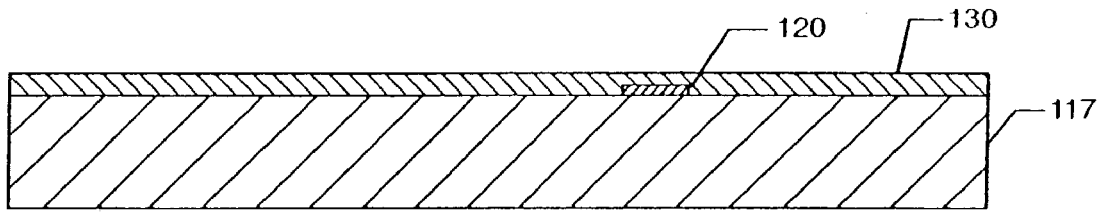

FIG. 4B shows a second step of the process, where a sacrificial layer 130 is deposited on the substrate 117 and on the metal layer forming the contact pad 120. A sacrificial layer is a layer which is first deposited in a step of a process and then removed in a further step of the process. The thickness of the layer 130 determines the air gap (i.e. the distance between the contact pads 119 and 120) for the switch. The sacrificial layer 130 is, for example, a 1 μm thick layer made of silicon dioxide ($SiO_2$) which may be deposited using PECVD (Plasma Enhanced Chemical Vapor Deposition).

Figure 4C:
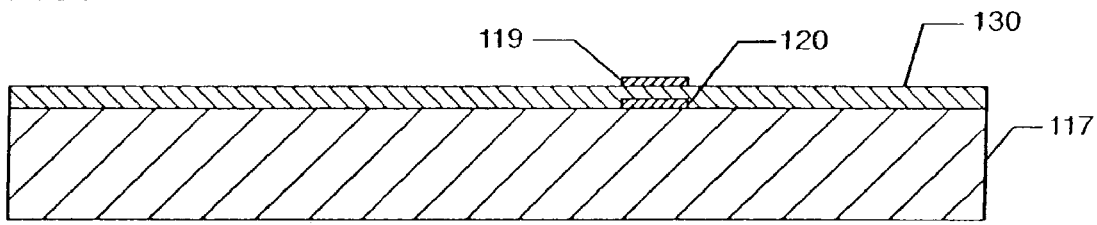

FIG. 4C shows a third step of the process, where a second metal layer forming the top contact pad 119 of the switch 100 is deposited on the sacrificial layer 130. The second metal layer is patterned to form the top contact pad 119 using, for example, electron beam evaporation and liftoff. The second metal layer is, for example, a 0.2 μm thick Ti/Pt layer.

Figure 4D:
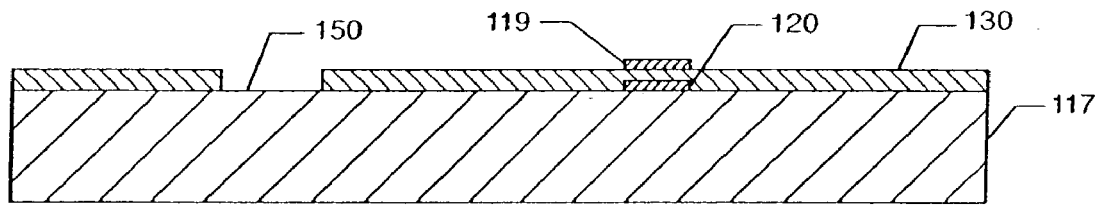

FIG. 4D shows a fourth step of the process, where the sacrificial layer 130 is etched (for example dry or wet etching) after deposition and patterning of a photoresist layer, not shown in the figure. The etching step creates a hole 150 in the structure.

Figure 4E:
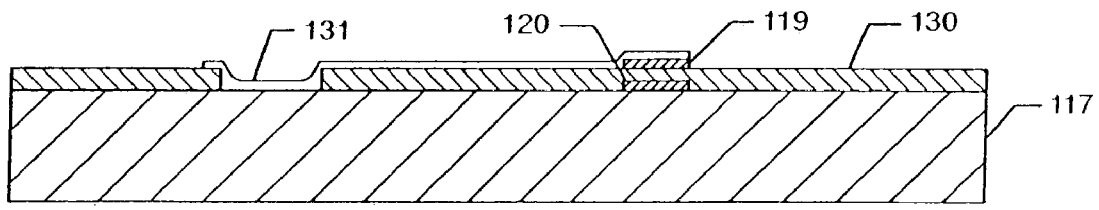

FIG. 4E shows a fifth step of the process, where a layer 131 is deposited above the sacrificial layer 130, the top contact pad 119 and the hole 150. The layer 131 is, for example, a 0.1 to 0.5 μm thick layer made of $Si_3N_4$, which is deposited using PECVD. The layer 131 will be patterned to form the layer 116 shown in FIG. 2A. The use of the layer 131 is preferred, because it provides support and mechanical strength to the final released structure. The thickness of the layer 131 may be adjusted to compensate for any stress related bending.

The layer 131 can be patterned at the present stage or later, depending on the etch method used for the piezoelectric layer 111 in FIG. 5A below. Should the piezoelectric layer 111 of FIG. 5A be etched through a dry etch process, the layer 131 can be patterned at the present stage. Should the piezoelectric layer 111 of FIG. 5A be etched through a wet etch process, the layer 131 is preferably patterned at a later stage, because it serves to protect the underlying sacrificial layer 130 from the etching chemicals, some of which may attack the sacrificial layer 130.

Figure 4F:
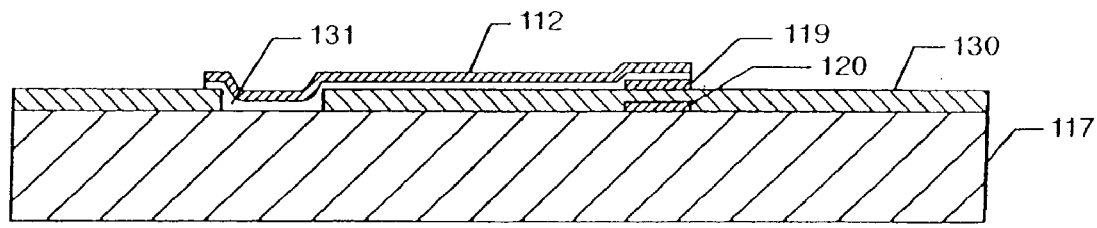

FIG. 4F shows a sixth step of the process, where a third metal layer, forming the first electrode 112, is deposited above the layer 131. The layer forming the first electrode 112 is, for example, a 0.2 μm thick Ti/Pt layer deposited using liftoff technique.

Figure 5A:
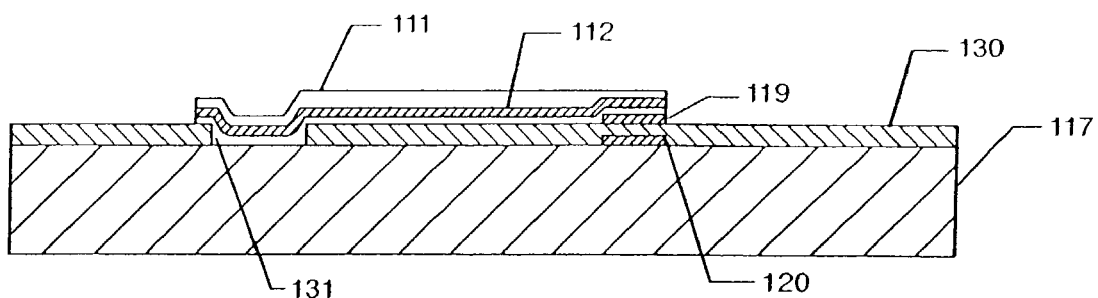

FIG. 5A shows a seventh step of the process, where a first piezoelectric layer, forming the lower piezoelectric layer 111, is deposited. The layer 111 is, for example, a 0.5 μm thick PZT or PLZT layer deposited using, for example, sol-gel deposition technique. Such technique is known to the person skilled in the art and will not be described in detail. The process of depositing the layer 111 preferably involves an annealing step at about 500–700° C. The layer 111 can be patterned using a variety of dry or wet etch techniques.

Figure 5B:
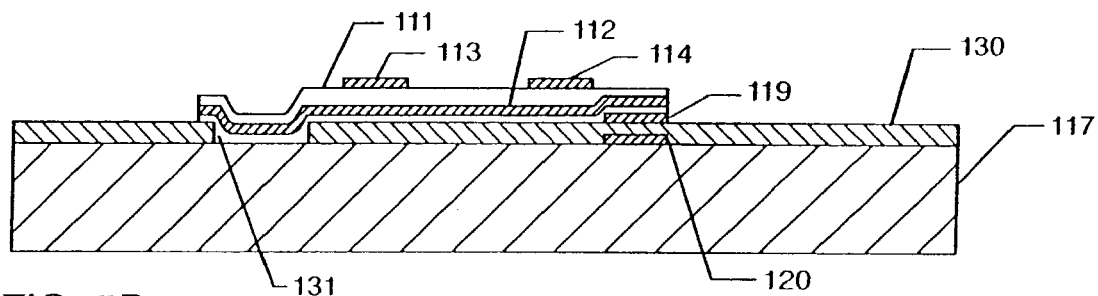

FIG. 5B shows an eighth step of the process, where a fourth metal layer is deposited above the layer 111 and patterned to form the second electrode 113 and the fourth electrode 114. The electrodes 113 and 114 are formed, for example, by a 0.2 μm thick Ti/Pt layer deposited using electron beam evaporation and liftoff.

Figure 5C:
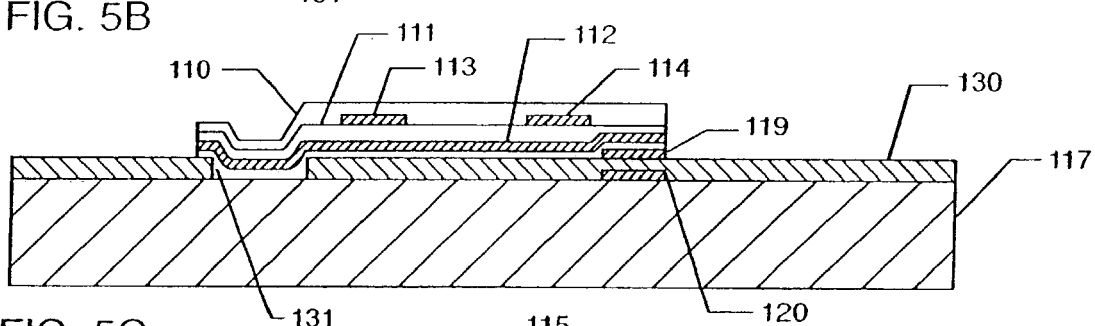

FIG. 5C shows a ninth step of the process, where a second piezoelectric layer forming the upper piezoelectric layer 110 is deposited. The layer 110 is, for example, a 0.5 μm thick PZT or PLZT layer deposited using, for example, a sol-gel deposition technique.

Figure 5D:
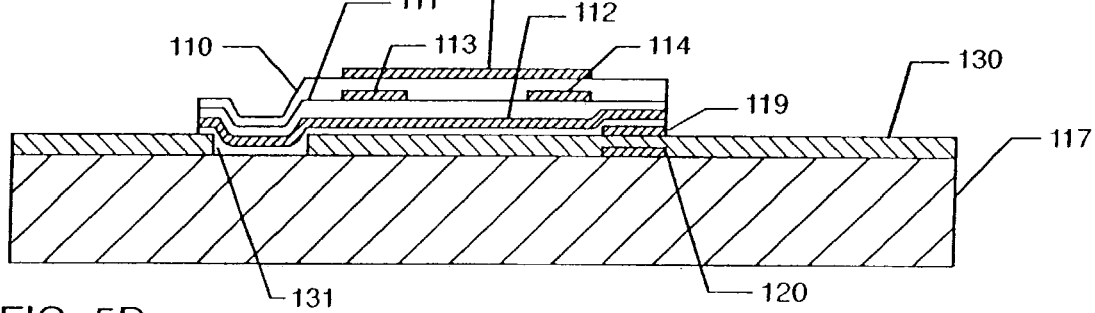

FIG. 5D shows a tenth step of the process, where a fifth metal layer forming the fourth electrode 115 is deposited above the upper piezoelectric layer 110. The fifth metal layer is, for example, a 0.2 μm thick Ti/Pt layer deposited using electron beam evaporation and liftoff.

Figure 5E:
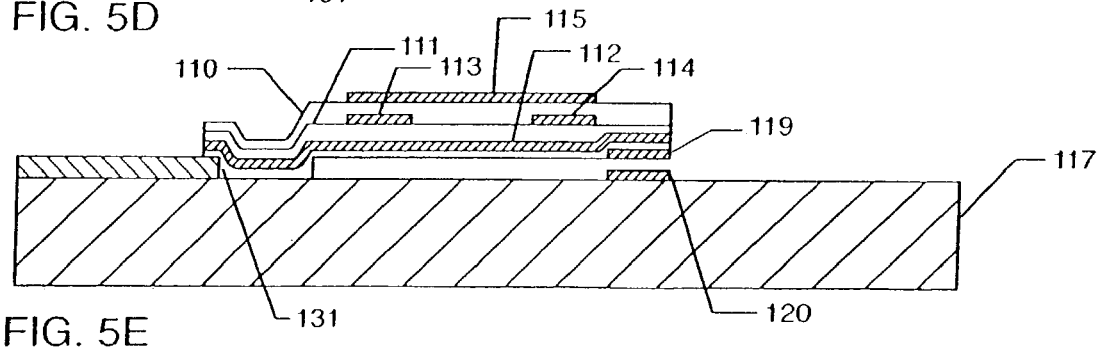

FIG. 5E shows an eleventh step of the process, where the sacrificial layer 130 is removed by using chemical release methods known in the art, for example by means of hydrofluoric acid (HF).

With reference to the single-layered structure shown in FIGS. 3A and 3B, such structure can be obtained through the steps shown in FIGS. 4A–4F combined with the steps shown in FIGS. 5A, 5B and 5E.

It will also be appreciated that the spacer 118 shown in FIGS. 2A and 2C is formed, in the preferred embodiment, by the left portion of the layers 111 and 131.

FIGS. 6A–6F show an alternative embodiment of the steps shown in FIGS. 4C–4F, respectively.

Figure 6A:
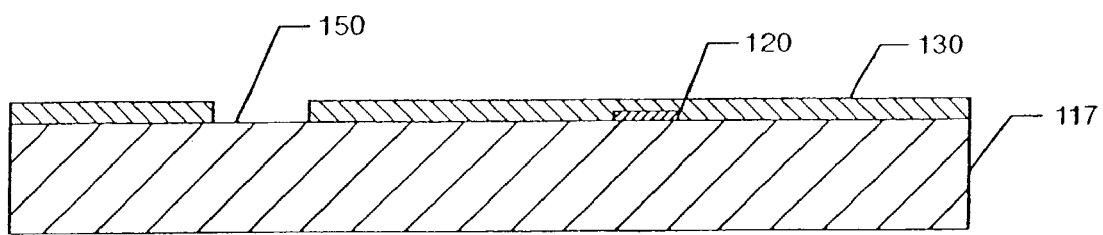
FIGS. 6A–6F show an alternate embodiment of the fabricating steps shown in FIGS. 4C–4F, respectively.

FIG. 6A shows an alternate third step of the process, where the sacrificial layer 130 is etched (for example dry or wet etching) after deposition and patterning of a photoresist layer, not shown in the figure. The etching step creates the hole 150 in the structure.

Figure 6B:
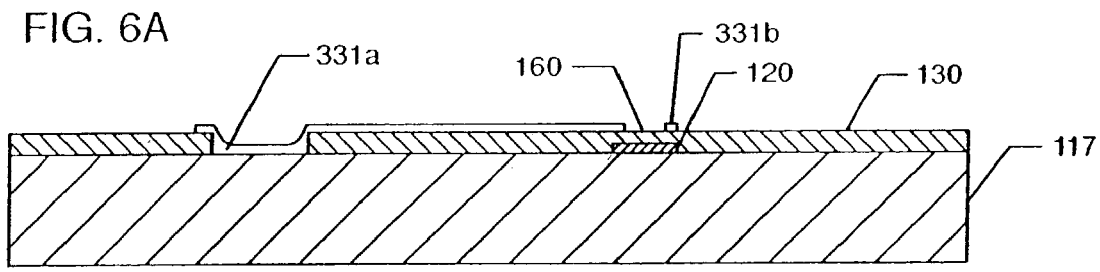

FIG. 6B shows an alternate fourth step of the process, following the alternate third step of FIG. 6A, where a layer 331 is deposited above the sacrificial layer 130. The layer 331 is, for example, a 0.1 to 0.5 μm thick layer made of $Si_3N_4$, which is deposited using PECVD. The layer 331 is patterned to form portions 331a and 331b. The region between portions 331a and 331b is indicated 160.

Figure 6C:
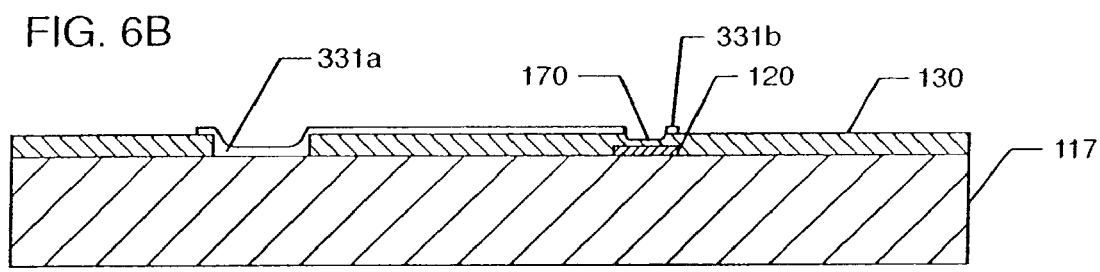

FIG. 6C shows an alternate fifth step of the process, following the alternate fourth step of FIG. 6B, where the region 160 is dry or wet etched to form a trench 170 having a preferred depth of about 0.25 μm to about 0.5 μm.

Figure 6D:
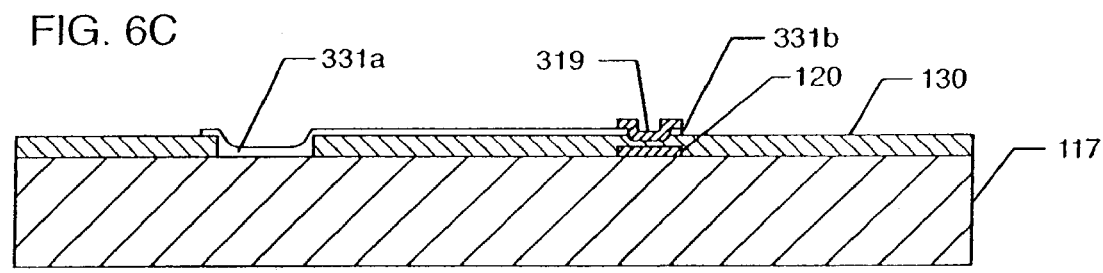

FIG. 6D shows an alternate sixth step of the process, following the alternate fifth step of FIG. 6C, where a metal layer forming a top contact pad 319 is deposited and patterned on the sacrificial layer 130, in and above the trench 170.

Figure 6E:
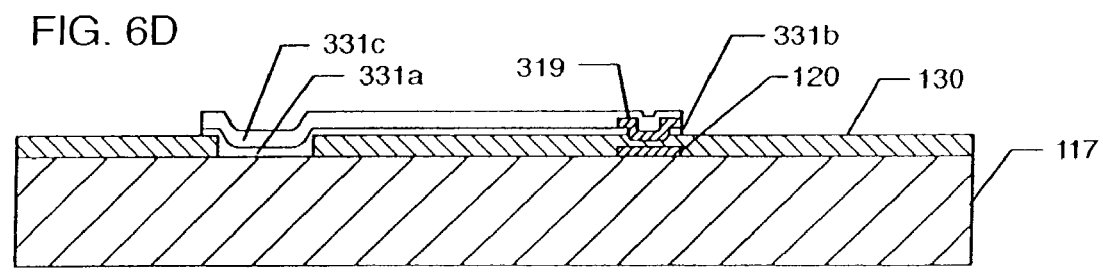

FIG. 6E shows an alternate seventh step of the process, following the alternate sixth step of FIG. 6D, where a non-metal separation layer 331c is deposited above the layers 331a, 331b and the top contact pad 319. The layer 331c is, for example, a 0.1 to 0.5 μm thick layer made of $Si_3N_4$, which is deposited using PECVD.

Figure 6F:
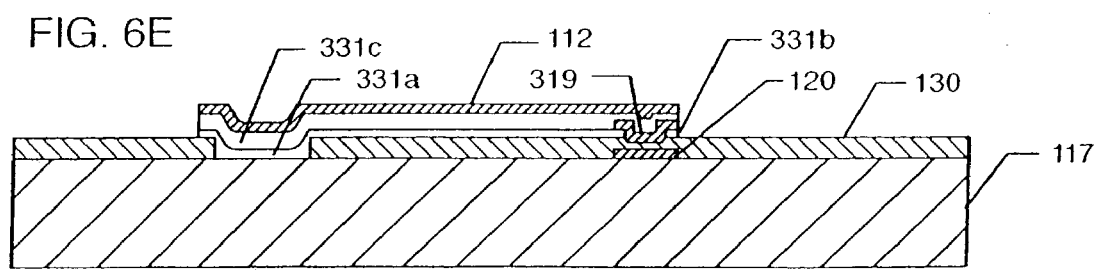

FIG. 6F shows an alternate eight step of the process, following the alternate seventh step of FIG. 6E, where a metal layer 112 is deposited above the layer 331c.

The alternate embodiment shown in FIGS. 6A–6F ensures that the top contact pad 319 is held more securely between the $Si_3N_4$ and PZT layers and that a better contact with the bottom pad 120 is obtained.

Figure 7A:
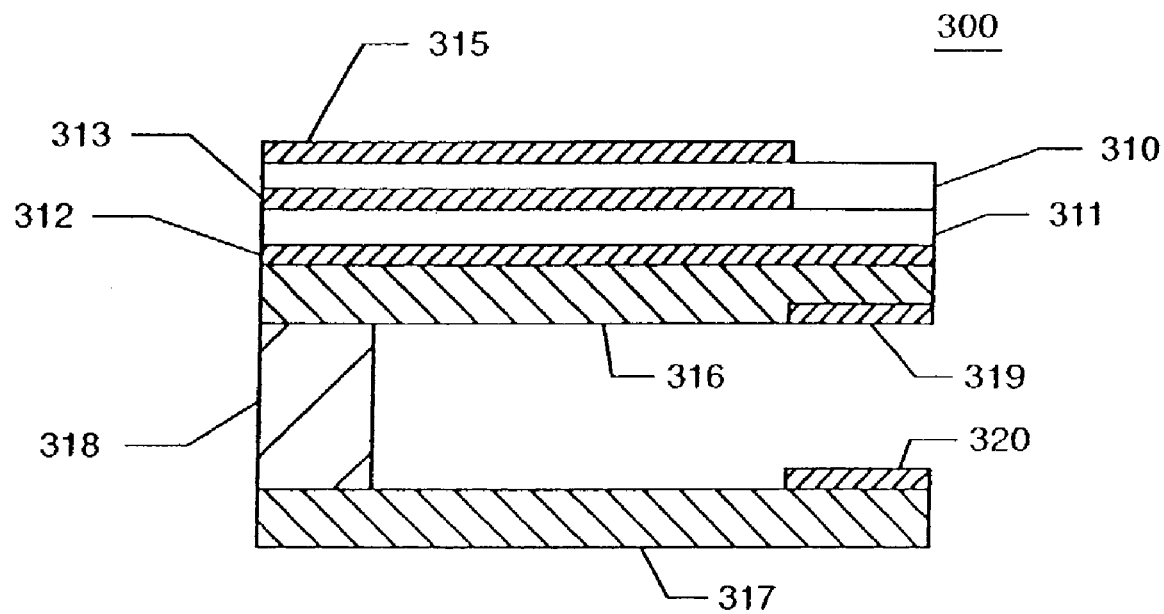
Figure 7B:
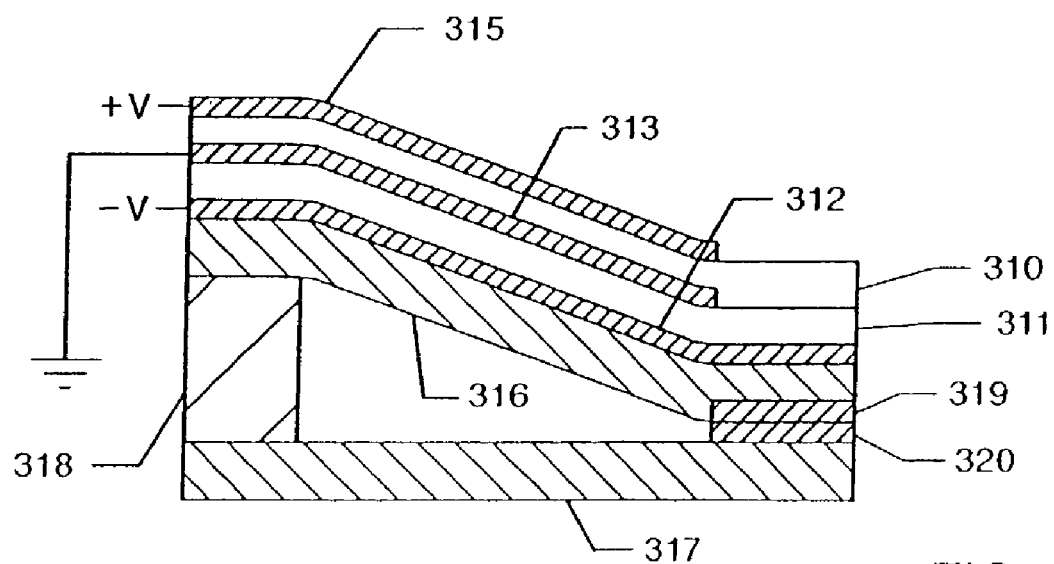

FIGS. 7A–7B show a switch according to a third embodiment of the present invention, where only three electrodes are used, and cross voltages are applied to the upper and lower electrodes.

FIG. 7A shows a switch 300 comprising an upper piezoelectric layer 310, a lower piezoelectric layer 311, a first or lower electrode 312 placed under the lower layer 311, a second or middle electrode 313 placed between the upper layer 310 and the lower layer 311, and a third or upper electrode 315 placed above the upper layer 310. A $Si_3N_4$ layer 316 is connected to the electrode 312 and placed under the electrode 312. The switch 300 is placed above a substrate 317 and spaced from the substrate 317 by means of a spacer 318. Additionally, a first contact pad 319 is provided under the second electrode 312 and a second contact pad 320 is provided above the substrate 317.

Also in the third embodiment, an 'S' shaped deformation or deflection is obtained upon application of a voltage, as shown in FIG. 7B. The 'S' shaped deformation is obtained by virtue of the 'crossed' actuation voltages applied to the lower and upper electrodes 312, 315, where the lower electrode 312 is provided with a voltage having a first polarity (for example a negative voltage −V) and the upper electrode 315 is provided with a voltage having a second polarity different from the first polarity (for example a positive voltage +V). By means of the deflection, the metal pad 319 is moved downwards and is brought into contact with the pad 320, thus actuating the switch to the "ON" position.

As already pointed out above, the third embodiment allows only three electrodes to be used instead of four. However, higher voltages than those employed in the first two embodiments are required.

Figure 8A:
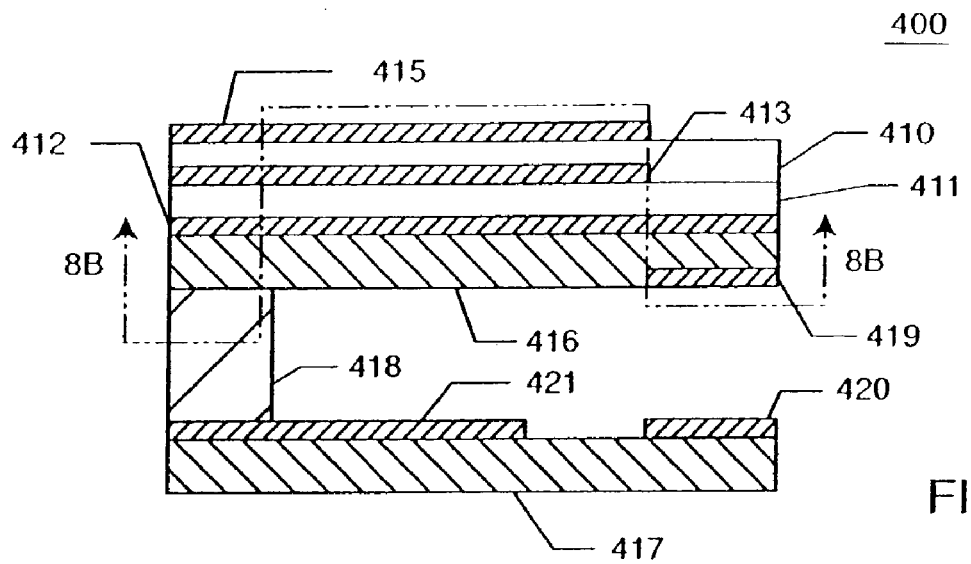
Figure 8B:
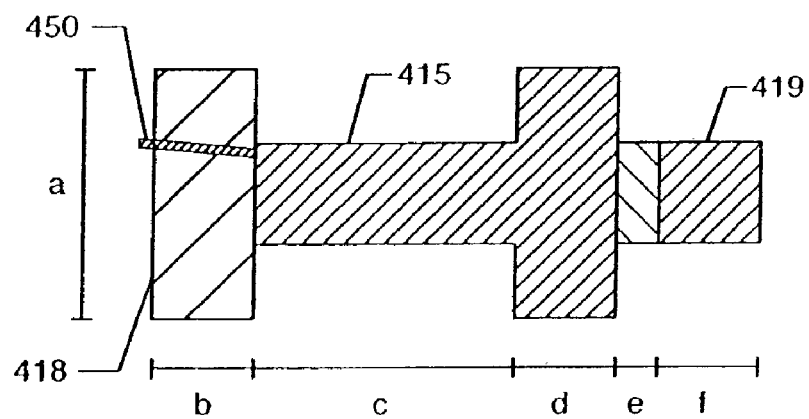
Figure 8C:
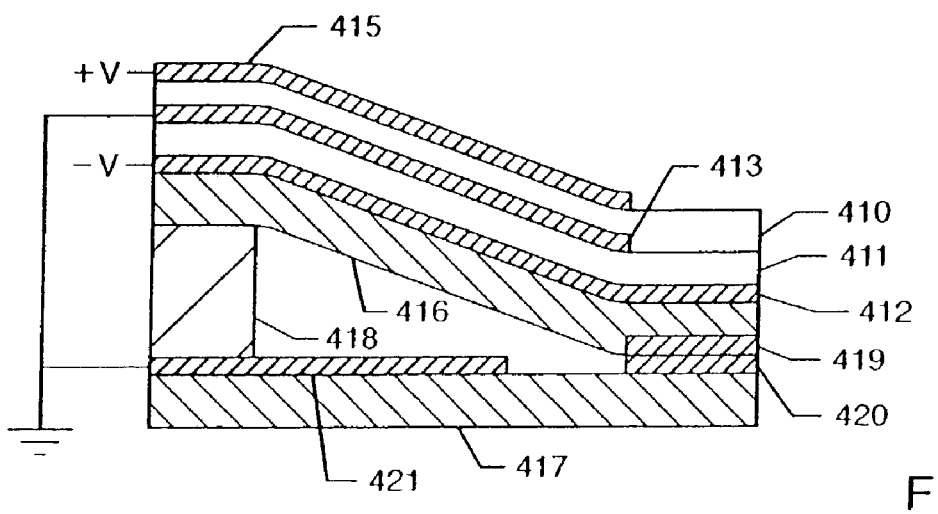

FIGS. 8A–8C show a switch according to a fourth embodiment of the present invention, where switching occurs according to a combination between electrostatic effect and piezoelectric effect. In particular, combination of the electrostatic effect with the embodiment of FIGS. 7A and 7B is shown.

FIG. 8A shows a switch 400 comprising an upper piezoelectric layer 410, a lower piezoelectric layer 411, a first or lower electrode 412 placed under the lower layer 411, a second or middle electrode 413 placed between the upper layer 410 and the lower layer 411, and a third or upper electrode 415 placed above the upper layer 410. A $Si_3N_4$ layer 416 is connected to the electrode 412 and placed under the electrode 412. The switch 400 is placed above a substrate 417 and spaced from the substrate 417 by means of a spacer 418. Additionally, a first contact pad 419 is provided under the second electrode 412 and a second contact pad 420 is provided above the substrate 417. The distance between contact pads 419 and 420 is preferably 1 µm.

In this fourth embodiment, an additional electrode 421 is provided on the substrate 417. The presence of the additional electrode 421 allows the piezoelectric effect of the switch to be combined with an electrostatic effect. The combination of the two effects has the advantage of significantly lowering the actuation voltages as compared to conventional electrostatic switches of similar dimensions.

FIG. 8B shows a schematic top section of the structure of FIG. 8A, taken along line 1—1 of FIG. 8A. FIG. 8B shows the support wall 418, the top electrode 415, and the top pad 419. Also shown in FIG. 8B is an exemplary form of a contact 450 between the electrode 415 and a voltage source (not shown). As shown in FIG. 8B, the electrode 415 is preferably T-shaped. In this way, a larger area of the electrode 415 is obtained, with corresponding increase of the electrostatic actuation effect.

Dimension 'a' of FIG. 8B is preferably 30 µm long. Dimensions 'b' and 'd' are preferably 10 µm long. Dimension 'c' is preferably 35 µm long. Dimension 'e' is preferably 5 µm long. Dimension f is preferably 10 µm long.

Also in the fourth embodiment, an 'S' shaped deformation or deflection is obtained upon application of a voltage, as shown in FIG. 8C. The 'S' shaped deformation is obtained by virtue of the 'crossed' actuation voltages applied to the lower and upper electrodes 412, 415, where the lower electrode 412 is provided with a voltage having a first polarity (for example a negative voltage −V) and the upper electrode 415 is provided with a voltage having a second polarity different from the first polarity (for example a positive voltage +V). By means of the deflection, the metal pad 419 is moved downwards and is brought into contact with the pad 420, thus actuating the switch to the "ON" position.

When applying opposite voltages to the lower and upper electrodes, a large initial deflection is obtained due to the piezoelectric effect. This places the electrodes for electrostatic actuation much closer together, and a relatively small increase in the actuation voltage causes the switch to close. In particular, the piezoelectric component of the attractive force is usually linear with the dimension of the gap, while the electrostatic component of the attractive force is very small when the gap is large and very high when the gap is small.

The actuation voltage of a switch having a combined piezoelectric-electrostatic effect of FIG. 8C is in the range of 30–40 V. In the absence of the piezoelectric effect, i.e. for a purely electrostatic switch of similar dimensions, an actuation voltage of about 80 V would be needed. Hence, the embodiment shown in FIGS. 8A–8C achieves a significant lowering of the actuation voltage when compared with prior art electrostatic switches. The response time is about 4 µs.

FIGS. 9A–9F and 10A–10E show one possible method of fabricating the switch 400 described in FIGS. 8A–8C. The switch 400 may be manufactured using generally known microfabrication techniques, such as masking, etching, deposition and lift-off. The switch 400 may be fabricated using, for example, a foundry-based polysilicon surface-micromachining process, or a metal/insulator surface-micromachining process. The substrate 417 for one preferred embodiment may be a GaAs wafer, although other materials such as Si, GaN, InP, ceramics, or quartz may be used. Note that the switch 400 may be fabricated by processes other than that depicted in FIGS. 9 and 10. Further, while FIGS. 9 and 10 depict multiple separate fabrication steps, alternative fabrication processes may allow several separate steps to be combined into fewer steps. Finally, alternative fabrication processes may use a different sequence of steps.

Figure 9A:
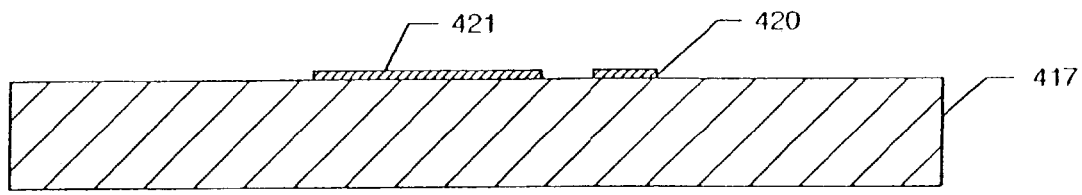
FIGS. 9A–9F and 10A–10E show process steps in fabricating the switch of FIGS. 8A–8C.

FIG. 9A shows a first step of the process, where a substrate 417 is provided and a first metal layer is deposited on the substrate 417. The metal layer is patterned to form the bottom contact pad 420 and the bottom electrode 421 using, for example, electron beam evaporation or liftoff. The metal layer is, for example, a 0.2 µm thick Ti/Pt layer.

Figure 9B:
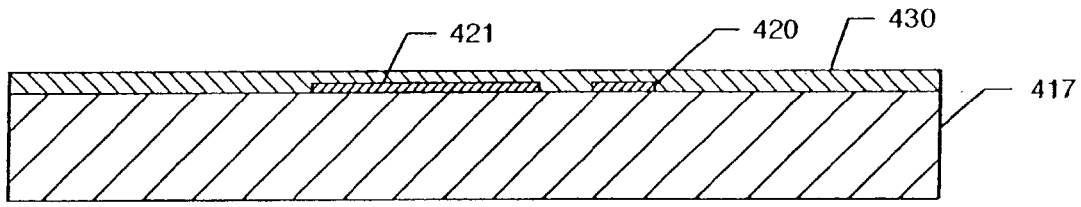

FIG. 9B shows a second step of the process, where a sacrificial layer 430 is deposited on the substrate 417 and on the bottom contact pad 420 and bottom electrode 421. The thickness of the layer 430 determines the air gap for the switch. The layer 430 is, for example, a 1 µm thick layer made of $SiO_2$, which is deposited using PECVD.

Figure 9C:
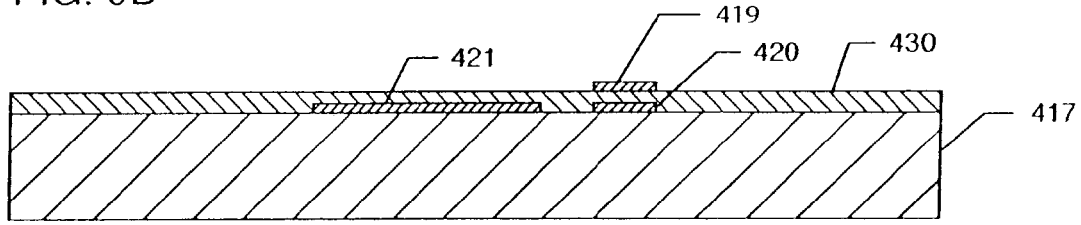

FIG. 9C shows a third step of the process, where a second metal layer is deposited and patterned to form the top contact pad 419.

Figure 9D:
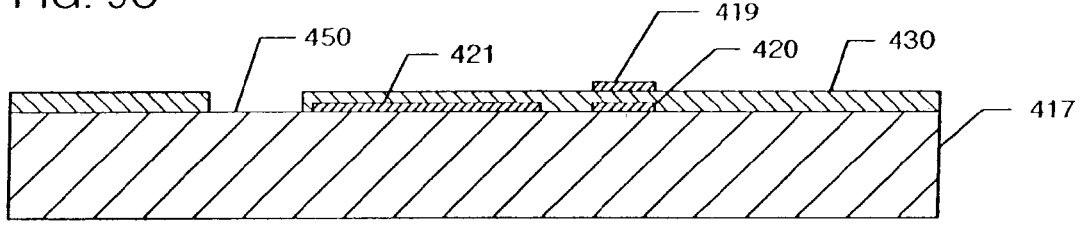

FIG. 9D shows a fourth step of the process, where the layer 430 is etched (for example dry or wet etching) after deposition and patterning of a photoresist layer, not shown in the figure. The etching step creates a hole 450 in the structure.

Figure 9E:
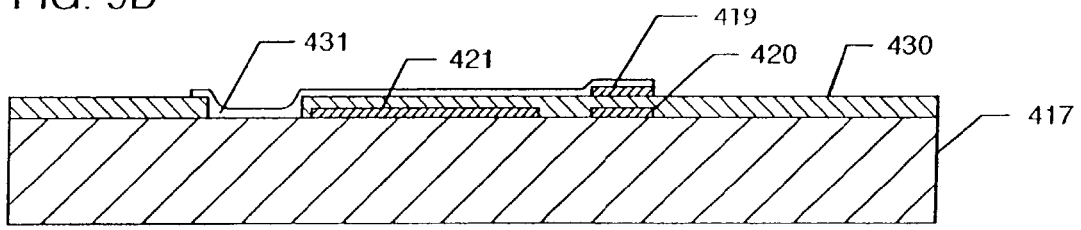

FIG. 9E shows a fifth step of the process, where a layer 431 is deposited. The layer 431 is, for example, a 0.1 to 0.5 µm thick layer made of $Si_3N_4$, which is deposited using PECVD. The layer 431 forms the layer 416 shown in FIGS. 8A and 8C. The presence of a layer 431 is preferred, because it provides mechanical strength to the final released structure. Additionally, the layer 431 prevents a short-circuit between the electrodes 412 and 421 when the switch is closed. The thickness of the layer 431 may be adjusted to compensate for any stress related bending.

Similarly to what explained with reference to FIG. 4E, the layer 431 can be patterned at the present stage or later, depending on the etch method used for the piezoelectric layer 411 in FIG. 10A below. Should the piezoelectric layer 411 of FIG. 10A be etched through a dry etch process, the layer 431 can be patterned at the present stage. Should the piezoelectric layer 411 of FIG. 10A be etched through a wet etch process, the layer 431 is preferably patterned at a later stage, because it serves to protect the underlying layer 430 from the etching chemicals, some of which may attack the layer 430.

Figure 9F:
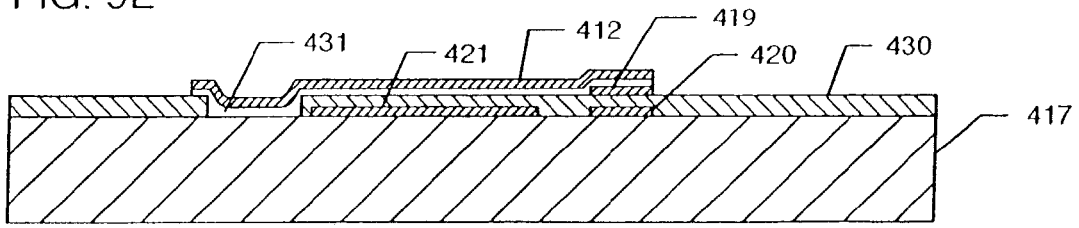

FIG. 9F shows a sixth step of the process, where a second metal layer, forming the first electrode 412, is deposited above the layer 431. The second metal layer is, for example, a 0.1 µm thick Ti/Pt layer deposited using liftoff technique.

Figure 10A:
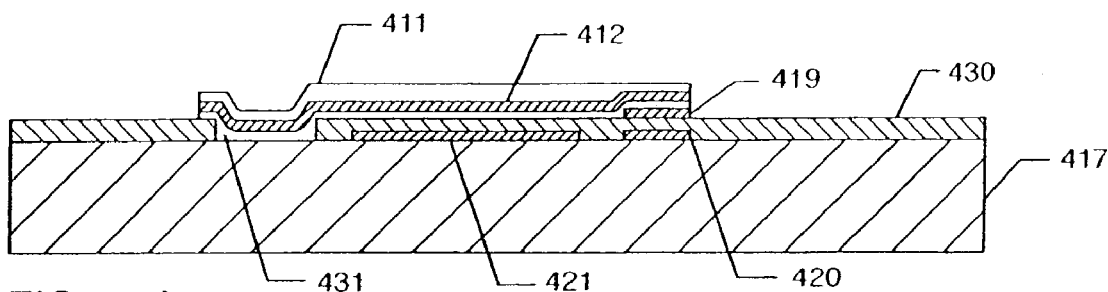

FIG. 10A shows a seventh step of the process, where a first piezoelectric layer forming the lower piezoelectric layer 411 is deposited. The layer 411 is, for example, a 0.5 µm thick PZT or PLZT layer deposited using a sol-gel deposition technique. The process of depositing the layer 411 involves an annealing step at about 500–700° C. The layer 411 can be patterned using a variety of dry or wet etch techniques.

Figure 10B:
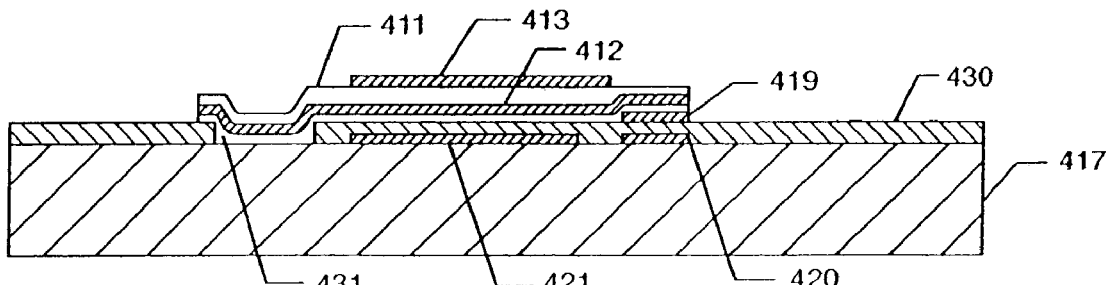

FIG. 10B shows an eighth step of the process, where a third metal layer, forming the second electrode 413, is deposited above the layer 411. The electrode 413 is formed, for example, by a 0.1 µm thick Ti/Pt layer deposited using liftoff technique.

Figure 10C:
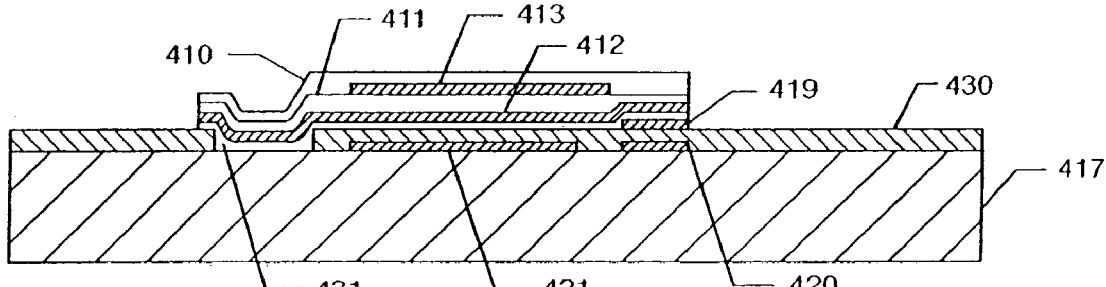

FIG. 10C shows a ninth step of the process, where a second piezoelectric layer forming the upper piezoelectric layer 410 is deposited. The layer 410 is, for example, a 0.5 µm thick PZT or PLZT layer deposited using, for example, a sol-gel deposition technique.

Figure 10D:
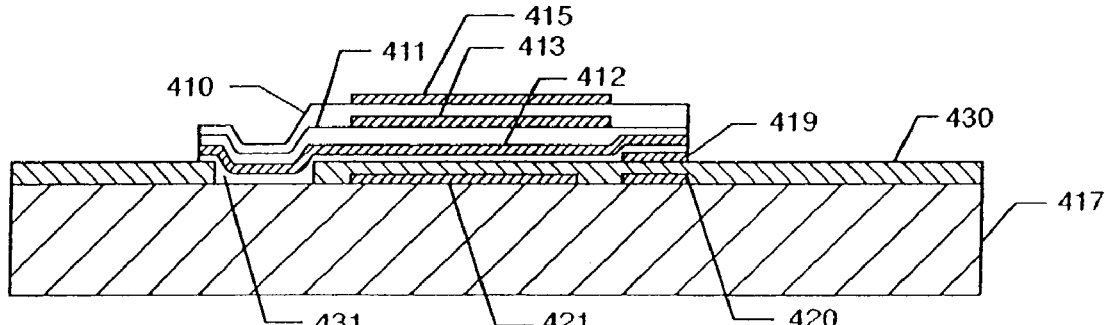

FIG. 10D shows a tenth step of the process, where a fourth layer, forming the third electrode 415 is deposited above the layer 410. The deposited layer is, for example, a 0.1 µm thick Ti/Pt layer deposited using liftoff technique.

Figure 10E:
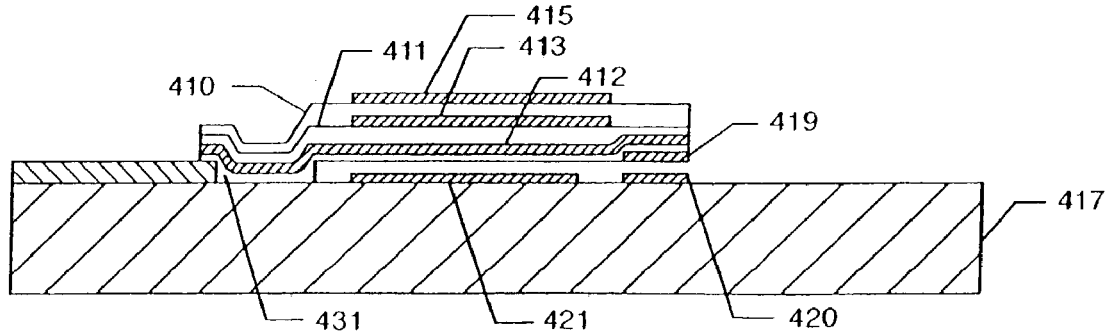

FIG. 10E shows an eleventh step of the process, where the sacrificial layer 430 is removed, for example by means of hydrofluoric acid (HF).

From the process steps shown in FIGS. 9 and 10 it is also clear that a structure like the one depicted in FIGS. 7A and 7B can be obtained, the only difference being the absence of the metal element 421 in the deposition step of FIG. 9B.

It will also be appreciated that the spacer 418 shown in FIGS. 8A–8C is formed, in the preferred embodiment, by the left portion of the layers 411 and 431.

Additionally, similarly to what shown in FIGS. 6A–6D, FIGS. 11A–11D show an alternative embodiment of the steps shown in FIGS. 9C–9F, respectively.

Figure 11A:
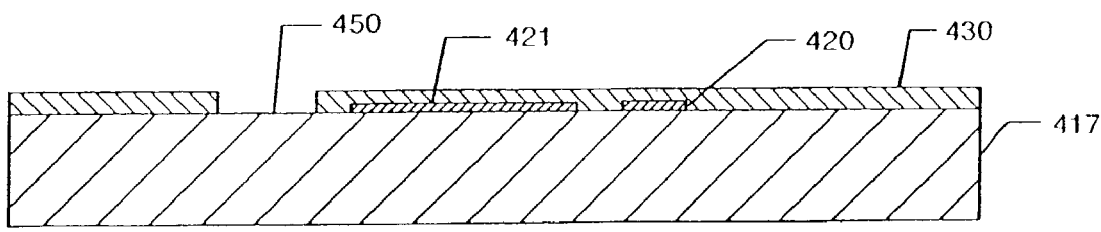
FIGS. 11A–11F show an alternate embodiment of the fabricating steps shown in FIGS. 9C–9F, respectively.

FIG. 11A shows an alternate third step of the process of FIGS. 9 and 10, where the sacrificial layer 430 is etched (for example dry or wet etching) after deposition and patterning of a photoresist layer, not shown in the figure. The etching step creates the hole 450 in the structure.

Figure 11B:
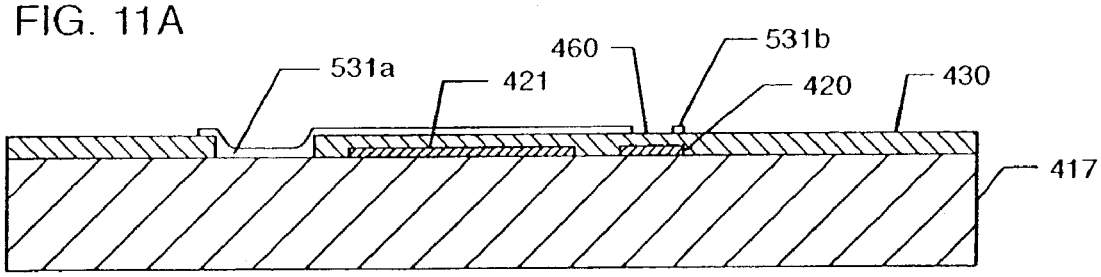

FIG. 11B shows an alternate fourth step of the process, following the alternate third step of FIG. 11A, where a layer 531 is deposited above the sacrificial layer 430. The layer 531 is, for example, a 0.1 to 0.5 µm thick layer made of $Si_3N_4$, which is deposited using PECVD. The layer 531 is patterned to form portions 531a and 531b. The region between portions 531a and 531b is indicated 460.

Figure 11C:
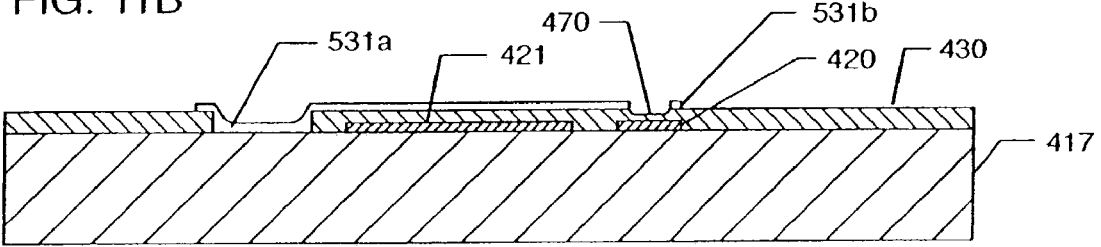

FIG. 11C shows an alternate fifth step of the process, following the alternate fourth step of FIG. 11B, where the region 460 is dry or wet etched to form a trench 470 having a preferred depth of about 0.25 µm to about 0.5 µm.

Figure 11D:
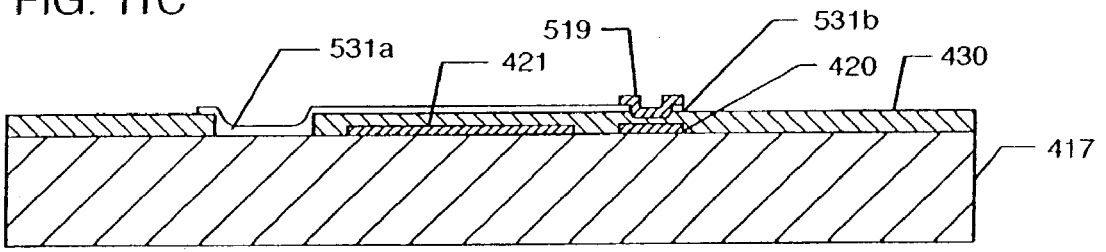

FIG. 11D shows an alternate sixth step of the process, following the alternate fifth step of FIG. 11C, where a metal layer forming a top contact pad 519 is deposited and patterned on the sacrificial layer 430, in and above the trench 470.

Figure 11E:
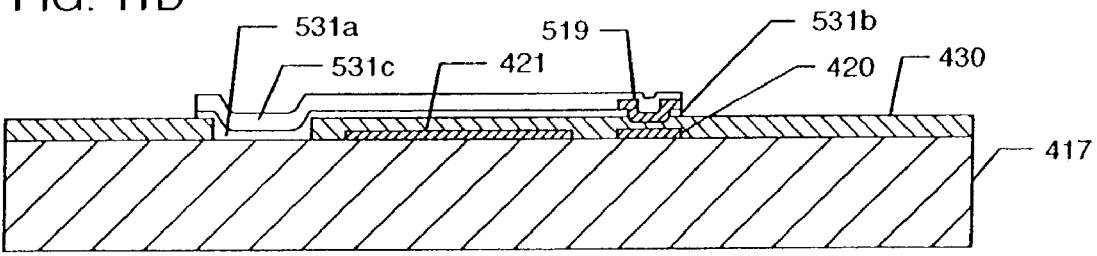

FIG. 11E shows an alternate seventh step of the process, following the alternate sixth step of FIG. 11D, where a non-metal separation layer 531c is deposited above the layers 531a, 531b and the top contact pad 519. The layer 531c is, for example, a 0.1 to 0.5 µm thick layer made of $Si_3N_4$, which is deposited using PECVD.

Figure 11F:
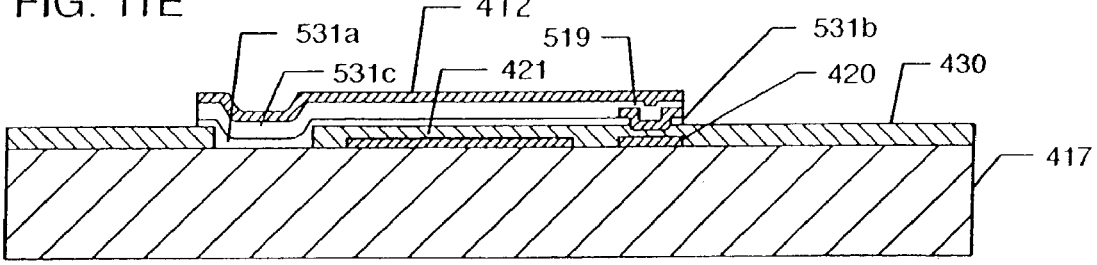

FIG. 11F shows an alternate eighth step of the process, following the alternate seventh step of FIG. 11E, where a metal layer 412 is deposited above the layer 531c.

The alternate embodiment shown in FIGS. 11A–11F ensures that the top contact pad 519 is held more securely between the $Si_3N_4$ and PZT layers and that a better contact with the bottom pad 420 is obtained.

Figure 12A:
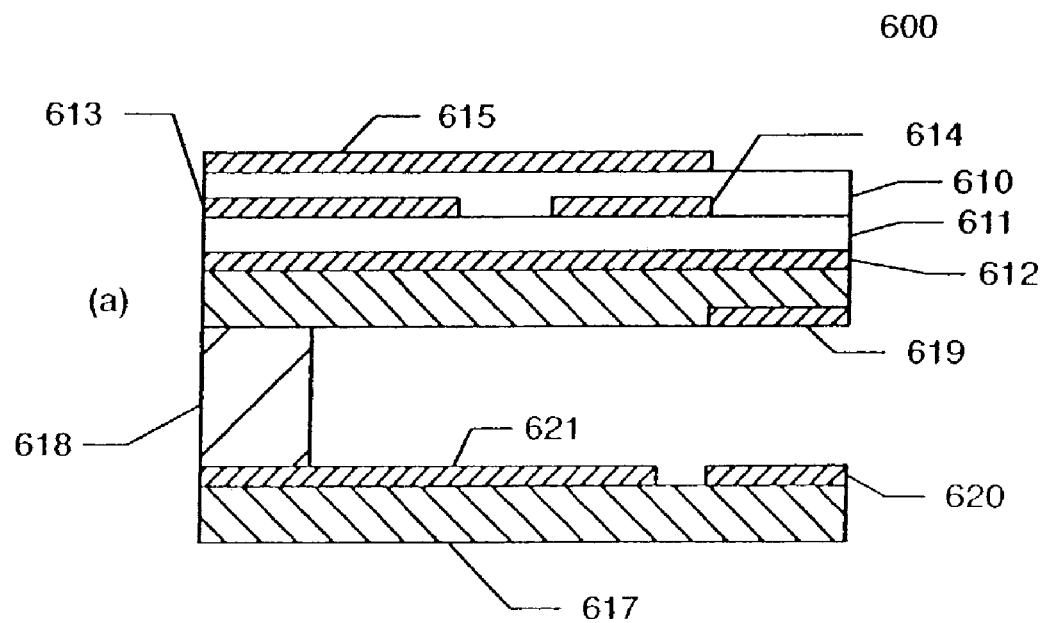
Figure 12B:
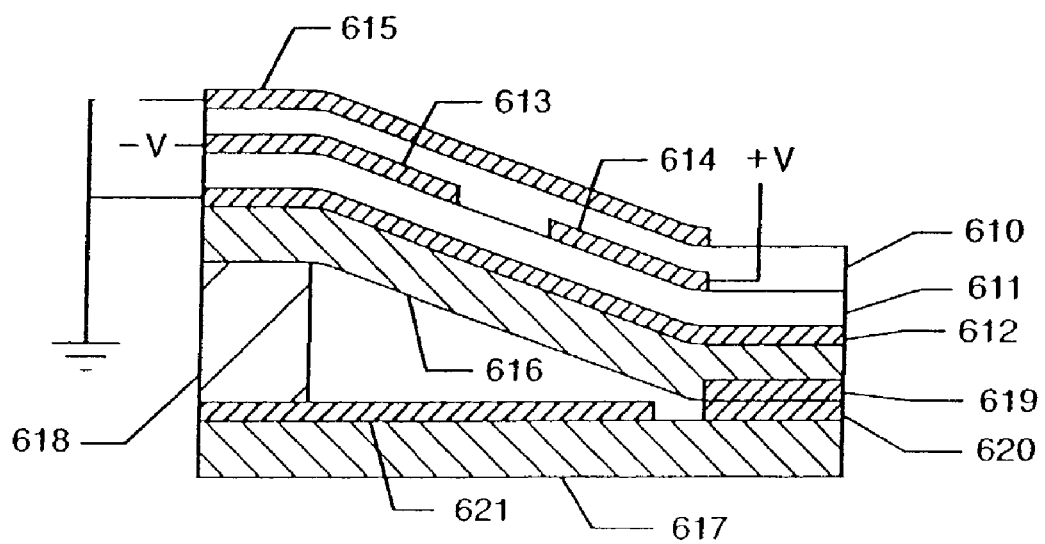

A third embodiment of the present invention is also possible, where the electrostatic effect is combined with the 'S' shaped deflection of the embodiment of FIGS. 2A–2C. This embodiment is shown in FIGS. 12A and 12B, where similar elements to the previous embodiments have been indicated by similar numbers.

Although the present invention has been described with respect to specific embodiments thereof, various changes and modifications can be carried out by those skilled in the art without departing from the scope of the invention. It is intended, therefore, that the present invention encompass changes and modifications falling within the scope of the appended claims.

What is claimed is:

1. A piezoelectric actuator comprising:
   an upper piezoelectric layer;
   a lower piezoelectric layer;
   a first electrode placed under the lower piezoelectric layer;
   a second electrode and a third electrode placed between the upper layer and the lower layer; and
   a fourth electrode placed above the upper piezoelectric layer,
   wherein the second electrode is connected to a first voltage having a first polarity and the third electrode is connected to a second voltage having a second polarity opposite the first polarity and
   wherein the actuator undergoes a substantially S-shaped deformation when the first voltage is applied to the second electrode and the second voltage is applied to the third electrode.

2. The actuator of claim 1, wherein the actuator is a micro electromechanical switch.

3. The actuator of claim 2, wherein said actuator is formed on a substrate.

4. The actuator of claim 3, further comprising a first contact pad provided under the lower piezoelectric layer and a second contact pad provided above the substrate.

5. The actuator of claim 4, wherein the first and second contact pad are chosen from the group consisting of gold, platinum, titanium-platinum, and titanium-gold.

6. The actuator of claim 4, wherein the first contact pad is positioned so as to face the second contact pad.

7. The actuator of claim 4, wherein the first contact pad is separated from the second contact pad when the actuator is in a first condition chosen from an ON condition and an OFF condition, and the first contact pad contacts the second contact pad when the actuator is in a second condition chosen from an ON condition and an OFF condition, different from the first condition.

8. The actuator of claim 7, wherein the distance between the first contact pad and the second contact pad when the actuator is in said first condition is about 1 µm.

9. The actuator of claim 2, further comprising a support layer connected to the first electrode and placed under the first electrode.

10. The actuator of claim 9, wherein the support layer is a $Si_3N_4$ layer.

11. The actuator of claim 2, wherein a spacer separates the switch from the substrate.

12. The actuator of claim 1, wherein the second electrode and the third electrode are placed between the upper layer and the lower layer at a same level.

13. The actuator of claim 1, wherein the substantially S-shaped deformation occurs by deflecting the upper and lower piezoelectric layers both downwards and upwards due to the first and second voltages applied to the second and third electrodes.

14. A micro electromechanical switch formed on a substrate and operating under a combined piezoelectric and electrostatic effect, the switch comprising:
a first piezoelectric layer;
a second piezoelectric layer;
a first electrode placed under the second piezoelectric layer;
a second electrode placed between the first piezoelectric layer and the second piezoelectric layer;
a third electrode placed on the first piezoelectric layer;
a fourth electrode placed on the substrate;
a first contact pad located under the second piezoelectric layer; and
a second contact pad connected with the substrate,
wherein the first contact pad is positioned so as to face the second contact pad and the fourth electrode is coplanar with the second contact pad.

15. The switch of claim 14, further comprising a support layer connected with the first electrode.

16. The switch of claim 14, wherein the first contact pad is separated from the second contact pad when the switch is in a first condition chosen from an ON condition and an OFF condition and the first contact pad contacts the second contact pad when the switch is in a second condition chosen from an ON condition and an OFF condition, different from the first condition.

17. The switch of claim 16, wherein the first electrode is connected to a voltage having a first polarity and the third electrode is connected to a voltage having a second polarity opposite the first polarity, and wherein the switch undergoes a substantially S-shaped deformation when the first contact pad contacts the second contact pad.

18. The switch of claim 14, wherein at least one of the first, second and third electrodes is T-shaped.

19. The switch of claim 14, wherein the first electrode is connected to a first voltage having a first polarity and the third electrode is connected to a second voltage having a second polarity opposite the first polarity, and wherein the switch undergoes a substantially S-shaped deformation when the first voltage is applied to the first electrode and the second voltage is applied to the third electrode.

20. The switch of claim 19, wherein the substantially S-shaped deformation occurs by deflecting the upper and lower piezoelectric layers both downwards and upwards due to the first and second voltages applied to the first and third electrodes.

21. The switch of claim 14, wherein the fourth electrode allows the piezoelectric and electrostatic effect to be combined.

22. The switch of claim 14, wherein the first contact pad and the second contact pad are made of a conductive material.

23. A micro electromechanical switch formed on a substrate and operating under a combined piezoelectric and electrostatic effect, the switch comprising:
a first piezoelectric layer;
a second piezoelectric layer;
a first electrode placed under the second piezoelectric layer;
a second electrode and a third electrode placed between the first piezoelectric layer and the second piezoelectric layer;
a fourth electrode placed on the first piezoelectric layer; and
a fifth electrode placed on the substrate.

24. The switch of claim 23, further comprising a support layer connected with the first electrode.

25. The switch of claim 23, further comprising a first contact pad located under the second piezoelectric layer and a second contact pad connected with the substrate, the first contact pad being positioned so as to face the second contact pad.

26. The switch of claim 25, wherein the first contact pad is separated from the second contact pad when the switch is in a first condition chosen from an ON condition and an OFF condition and the first contact pad contacts the second contact pad when the switch is in a second condition chosen from an ON condition and an OFF condition, different from the first condition.

27. The switch of claim 23, wherein the second electrode is connected to a voltage having a first polarity and the third electrode is connected to a voltage having a second polarity opposite the first polarity, and wherein the switch undergoes a substantially S-shaped deformation when the first contact pad contacts the second contact pad.

* * * * *